United States Patent
Siew et al.

(10) Patent No.: US 7,670,946 B2
(45) Date of Patent: Mar. 2, 2010

(54) METHODS TO ELIMINATE CONTACT PLUG SIDEWALL SLIT

(75) Inventors: Yong Kong Siew, Sungai Pelek (MY); Beichao Zhang, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 11/434,343

(22) Filed: May 15, 2006

(65) Prior Publication Data

US 2007/0264824 A1    Nov. 15, 2007

(51) Int. Cl.
*H01L 21/4763* (2006.01)
(52) U.S. Cl. .................. 438/637; 438/629; 438/618; 438/622; 438/640; 438/672; 438/675; 438/624; 438/738; 438/734; 438/742; 257/E21.584; 257/E21.586; 257/E21.214; 257/E21.483; 257/E21.304
(58) Field of Classification Search .................. 438/637
See application file for complete search history.

(56) References Cited

U.S. PATENT DOCUMENTS

| | | | | |
|---|---|---|---|---|
| 5,035,768 A * | 7/1991 | Mu et al. | | 216/60 |
| 5,422,315 A * | 6/1995 | Kobayashi | | 438/453 |
| 5,486,492 A * | 1/1996 | Yamamoto et al. | | 438/629 |
| 5,599,726 A * | 2/1997 | Pan | | 438/304 |
| 5,714,804 A * | 2/1998 | Miller et al. | | 257/763 |
| 5,766,992 A * | 6/1998 | Chou et al. | | 438/241 |
| 5,807,779 A * | 9/1998 | Liaw | | 438/279 |
| 5,899,742 A * | 5/1999 | Sun | | 438/682 |
| 5,913,143 A | 6/1999 | Harakawa | | |
| 5,990,020 A * | 11/1999 | Ha | | 438/738 |
| 6,001,726 A * | 12/1999 | Nagabushnam et al. | | 438/618 |
| 6,013,547 A * | 1/2000 | Liaw | | 438/238 |
| 6,083,828 A * | 7/2000 | Lin et al. | | 438/639 |
| 6,150,223 A * | 11/2000 | Chern et al. | | 438/303 |
| 6,177,340 B1 * | 1/2001 | Yoo et al. | | 438/637 |
| 6,218,255 B1 * | 4/2001 | Fritzinger et al. | | 438/386 |
| 6,225,204 B1 * | 5/2001 | Wu et al. | | 438/597 |
| 6,376,924 B1 * | 4/2002 | Tomita et al. | | 257/797 |
| 6,492,735 B1 * | 12/2002 | Matsubara | | 257/760 |
| 6,509,274 B1 * | 1/2003 | Guo et al. | | 438/697 |
| 6,573,147 B2 | 6/2003 | Moon | | |
| 6,670,268 B2 * | 12/2003 | Shin et al. | | 438/637 |
| 6,730,553 B2 * | 5/2004 | Cho et al. | | 438/210 |
| 6,756,691 B2 * | 6/2004 | Tomita et al. | | 257/797 |
| 6,818,457 B2 * | 11/2004 | Suzuki | | 438/3 |
| 6,953,724 B2 * | 10/2005 | Edleman et al. | | 438/244 |
| 7,135,403 B2 * | 11/2006 | Park | | 438/643 |

(Continued)

*Primary Examiner*—Fernando L Toledo
*Assistant Examiner*—Ankush K Singal
(74) *Attorney, Agent, or Firm*—Horizon IP Pte Ltd

(57) ABSTRACT

A method to form a barrier layer and contact plug using a touch up RIE. In a first embodiment, we form a first barrier layer over the dielectric layer and the substrate in the contact hole. The first barrier layer is comprised of Ta. A second barrier layer is formed over the first barrier layer. The second barrier layer is comprised of TaN or WN. We planarize a first conductive layer to form a first contact plug in the contact hole. We reactive ion etch (e.g., W touch up etch) the top surfaces using a Cl and B containing etch. Because of the composition of the barrier layers and RIE etch chemistry, the barrier layers are not significantly etched selectively to the dielectric layer. In a second embodiment, a barrier film is comprised of WN.

29 Claims, 8 Drawing Sheets

U.S. PATENT DOCUMENTS

| | | | |
|---|---|---|---|
| 7,169,662 B2* | 1/2007 | Cho et al. | 438/233 |
| 2001/0012690 A1* | 8/2001 | Zheng et al. | 438/637 |
| 2001/0018273 A1* | 8/2001 | Park et al. | 438/762 |
| 2001/0045662 A1* | 11/2001 | Kajita et al. | 257/767 |
| 2001/0055878 A1* | 12/2001 | Chooi et al. | 438/687 |
| 2002/0009891 A1* | 1/2002 | Ting et al. | 438/706 |
| 2002/0173144 A1* | 11/2002 | Yamamoto | 438/637 |
| 2003/0087520 A1* | 5/2003 | Chen et al. | 438/643 |
| 2003/0203512 A1 | 10/2003 | Kweon | |
| 2004/0178172 A1* | 9/2004 | Huang et al. | 216/20 |
| 2005/0136594 A1* | 6/2005 | Kim | 438/257 |
| 2005/0191820 A1* | 9/2005 | Tu et al. | 438/396 |
| 2005/0200026 A1* | 9/2005 | Liaw | 257/774 |
| 2006/0141700 A1* | 6/2006 | Nam | 438/243 |
| 2006/0163735 A1* | 7/2006 | Tseng | 257/758 |
| 2006/0246708 A1* | 11/2006 | Lee et al. | 438/618 |
| 2007/0111512 A1* | 5/2007 | Murata et al. | 438/622 |
| 2007/0155157 A1* | 7/2007 | Chou et al. | 438/618 |
| 2007/0161241 A1* | 7/2007 | Lee | 438/685 |
| 2007/0210454 A1* | 9/2007 | Chou et al. | 257/758 |
| 2007/0246831 A1* | 10/2007 | Gabric et al. | 257/758 |
| 2007/0257366 A1* | 11/2007 | Wang et al. | 257/751 |

* cited by examiner

METHODS TO ELIMINATE CONTACT PLUG SIDEWALL SLIT

BACKGROUND OF INVENTION

1) Field of the Invention

This invention relates generally to fabrication of semiconductor devices and more particularly to methods to form contact plugs and barrier layers and interconnects.

2) Description of the Prior Art

It is well known that integrated circuit fabrication on semiconductor wafers requires the formation of precisely controlled apertures, such as contact openings, that are subsequently filled with a conductive metal and interconnected to create components and very large scale integrated (VLSI) or ultra large scale integrated (ULSI) circuits. The methods for defining and forming such openings are equally well known to those who are skilled in the art. Market demands for faster and more powerful integrated circuits have resulted in significant growth in the number of devices per $cm^2$, i.e., a higher packing fraction of active devices. This increased packing fraction invariably means that the interconnections for ever-more-complicated circuits are made to smaller dimensions than before. Thus the aspect ratios of the contacts, i.e., the ratio of the opening depth to the opening diameter, have increased.

In the past, aluminum (Al) was deposited in the contact openings over a barrier layer to form contacts. However, some fabrication processes, especially those used to produce CMOS and bipolar semiconductors, now use tungsten (W) deposited within the contact opening over an adhesion/barrier layer of titanium/titanium nitride (Ti/TiN). Such adhesion/barrier layers are needed because of the extremely poor adhesion of tungsten applied by chemical vapor deposition (CVD) on such dielectrics as borophosphosilicate glass (BPSG), silicon dioxide, thermal oxide, and plasma-enhanced oxide and silicon nitride. However, it is known that tungsten adheres well to TiN and that TiN adheres well to Ti and that Ti, in turn, adheres well to the dielectrics listed. Thus, a method that achieves good adhesion of CVD tungsten to the substrate is achieved by interposing layers of titanium and titanium nitride between the dielectric and the tungsten plug.

However, the prior art W plug processes can be improved upon.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

U.S. Pat. No. 6,001,726: Method for using a conductive tungsten nitride etch stop layer to form conductive interconnects and tungsten nitride contact structure—forming a contact structure for a shallow junction device—Inventor: Nagabushnam, Rajan.

U.S. Pat. No. 6,573,147: Method of forming a semiconductor device having contact using crack-protecting layer—Formation of contact involves forming crack-protecting layer on interlayer dielectric layer—Inventor: Moon, Kwang-jin; Yongin, US20030203512A1: METHOD FOR FABRICATING SEMICONDUCTOR MEMORY DEVICE—Manufacture of semiconductor memory device, e.g. dynamic random access memory, by sequentially forming insulating layer, contact hole, first diffusion barrier, conductive layer, and conductive plug in semiconductor substrate.

U.S. Pat. No. 5,913,143: Method of making a multilayer interconnection of semiconductor device using plug. Inventor: Harakawa, Hideaki.

SUMMARY OF THE INVENTION

The below presents a simplified summary in order to provide a basic understanding of some aspects of example embodiments of the invention. This summary is not an extensive overview of the invention. It is intended neither to identify key or critical elements nor to delineate the scope of the embodiments. Rather, the primary purpose of the summary is to present some example concepts of the invention in a simplified form as a prelude to the more detailed description that is presented later.

The example embodiments of the present invention provides a structure and a method of manufacturing a contact with a barrier layer which is characterized as follows.

A first example embodiment of a method of fabrication of a semiconductor device; comprises the following:
   forming dielectric layer over a semiconductor substrate;
   forming a contact hole in said dielectric layer;
   forming a first barrier layer over said dielectric layer and said substrate in said contact hole; said first barrier layer is comprised of Ta;
   forming a second barrier layer over said first barrier layer; said second barrier layer is comprised of TaN or WN;
   forming a first conductive layer over said second barrier layer at least filling said contact hole;
   chemical-mechanical polishing said first conductive layer to form a first contact plug in said contact hole;
   in a cleaning step, cleaning said contact plug, said first barrier layer, said second barrier layer and said dielectric layer using an etch.

An aspect of the first example embodiment comprises:
   the cleaning step preferably comprises a Cl and B chemistry.

An aspect of the first example embodiment comprises:
   forming a second dielectric layer over said first dielectric layer and said first contact plug;
   forming an interconnect opening in said second dielectric layer exposing said contact plug;
   forming an interconnect in said interconnect opening contacting said contact plug.

A second example embodiment of a method of fabrication of a semiconductor device comprise;
   forming dielectric layer over a semiconductor substrate;
   forming a contact hole in said dielectric layer;
   forming a first barrier layer over said dielectric layer and said substrate in said contact hole; said first barrier layer is comprised of tungsten nitride;
   forming a first conductive layer over said first barrier layer at least filling said contact hole;
   chemical-mechanical polishing said first conductive layer to form a first contact plug in said contact hole;
   in a cleaning step, cleaning said contact plug, said first barrier layer, said second barrier layer and said dielectric layer using an etch;

An aspect of the first example embodiment comprises:
   the cleaning step preferably comprises a Cl and B chemistry.

An aspect of the second embodiment comprises:
   forming a second dielectric layer over said first dielectric layer and said first contact plug;

forming an interconnect opening in said second dielectric layer exposing said contact plug;

forming an interconnect in said interconnect opening contacting said contact plug.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE EXAMPLE EMBODIMENTS

All embodiments described are example embodiments. An example embodiment may contain elements of several claimed embodiments. The claims define the embodiments of the invention.

First Example Embodiment

A first example embodiment is shown in FIGS. 1 through 4. The first embodiment comprises (a) a contact plug that can be comprised of a Ta lower barrier layer and an upper barrier layer(s) comprised of TaN or WN and (b) a post CMP cleaning process.

Figure 1:
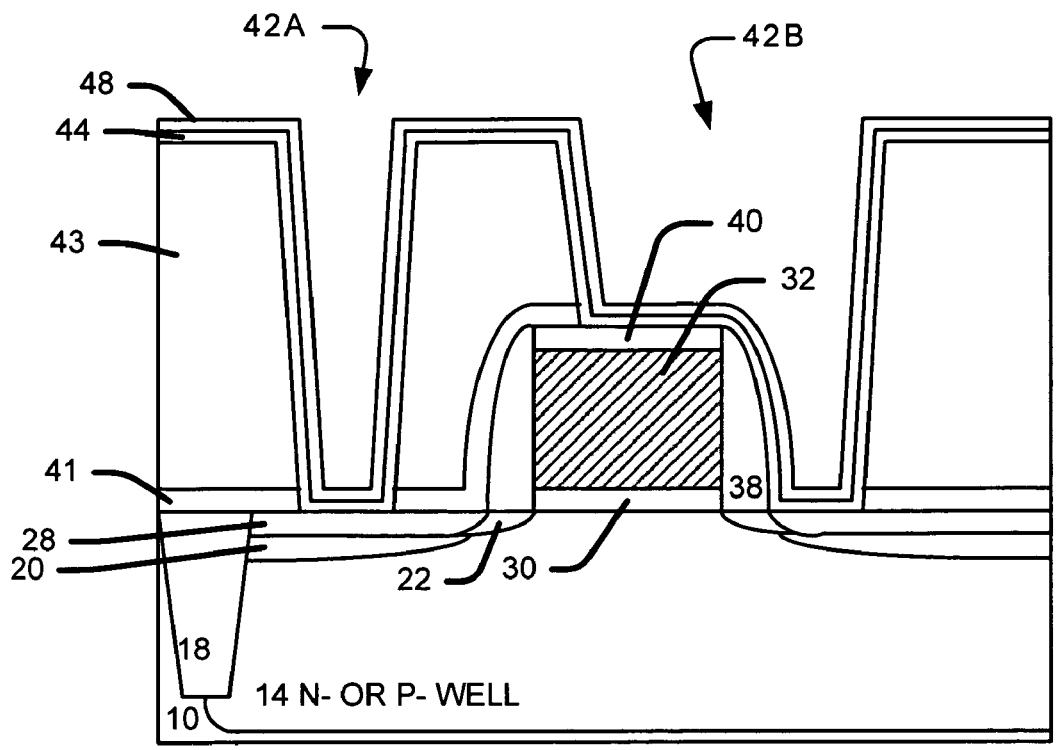
FIGS. 1 through 4 are cross sectional views for illustrating a method for manufacturing contact according to an first example embodiment of the present invention.

Referring to FIG. 1, we provide a semiconductor structure 10 such as a Si wafer.

We can provide devices on or in the semiconductor structure. For example, we can form a transistor. The transistor can be comprised of at least some of the following: a gate dielectric 30, gate electrode 32, gate silicide cap 40, sidewall spacer(s) 38, SDE (source drain extensions) 22 and source and drain regions 20, and S/D silicide regions 28.

We can form an etch stop layer 41 over the devices and substrate surface. The etch stop layer 41 can be comprised of silicon nitride.

Next, we form a dielectric layer (e.g., ILD layer) 43 over the semiconductor substrate 10. The dielectric layer can be comprised of silicon oxide, undoped silicon dioxide or $SiO_2$ doped with B &/or P and preferably of undoped silicon dioxide.

Next, we can form contact holes 42A 42B through the dielectric layer to expose the substrate or silicide 28 (if present). Contact hole 42B will be used to form a connection between the S/D region 20 and the gate silicide 40 using a subsequently formed plug. Contact hole 42A will be used to form a connection between the S/D region 20 and a higher metal layer using a subsequently formed plug.

A. First Barrier Layer (e.g., Ta)

Then we form a first barrier layer 44 over the dielectric layer 43 and the substrate 10 in the contact holes 42A 42B. Preferably the first barrier layer can be comprised of Ta and is preferably comprised essentially of Ta. The Ta is preferably formed by a physical vapor deposition process (PVD) and can have a thickness between 10 and 100 angstroms over the dielectric layer 43.

B. Second Barrier Layer (e.g., TaN or WN)

Still referring to FIG. 1, we form a second barrier layer 48 on the first barrier layer 44.

The second barrier layer 48 can be comprised of TaN (tantalum nitride) or WN (tungsten nitride) and combinations thereof and preferably consists essentially of TaN or WN. The TaN can be formed by a physical vapor deposition process (PVD) or Chemical vapor deposition process (CVD). The WN can be formed by a physical vapor deposition process (PVD) or chemical vapor deposition process (CVD).

The second barrier layer 48 can have a thickness between 10 and 500 angstroms over the dielectric layer.

C. First Conductive Layer

Then we form a first conductive layer (not shown) on the second barrier layer 48 at least filling the contact holes 42A 42B.

The first conductive can be comprised of tungsten (W) and is most preferably consists essentially of W. The W layer can be formed by forming a W nucleating layer and then forming a W layer using a CVD deposition process. The first conductive layer can be formed over top of the dielectric layer.

D. Planarize the First Conductive Layer

Figure 2:
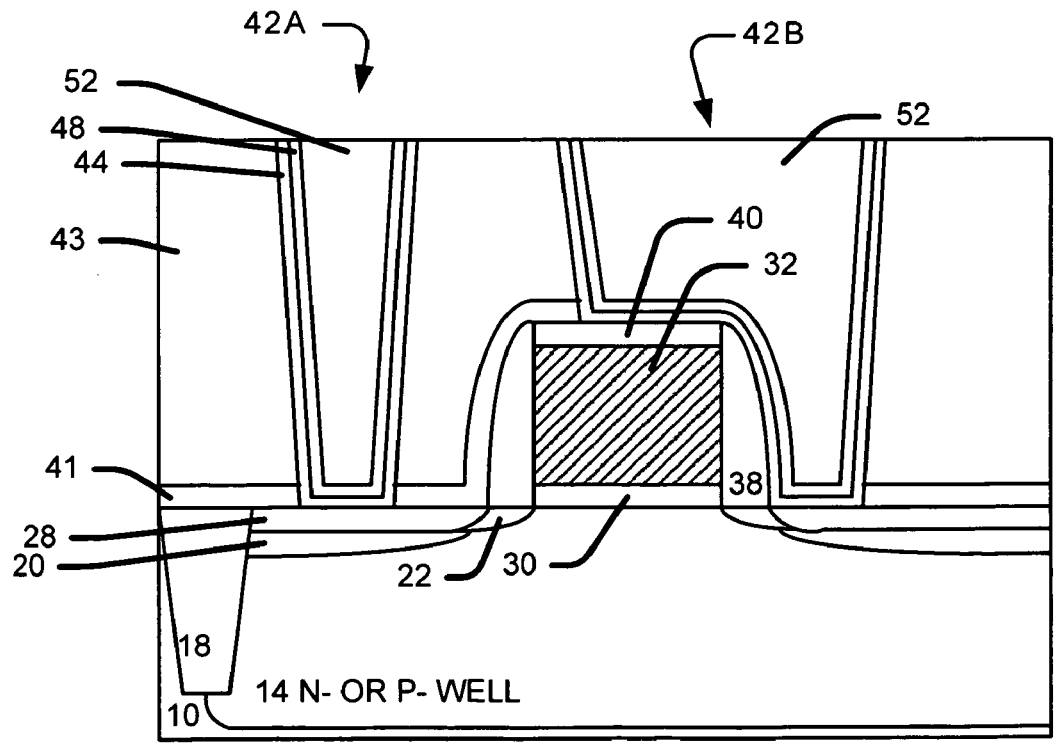

Referring to FIG. 2, we planarize the first conductive layer and remove the barrier layer from over the top of the dielectric layer preferably using a chemical-mechanical polishing (CMP) process to form first contact plugs 52 in the contact holes.

E. Cleaning Step (e.g., Touch Up Etch)

Figure 3:
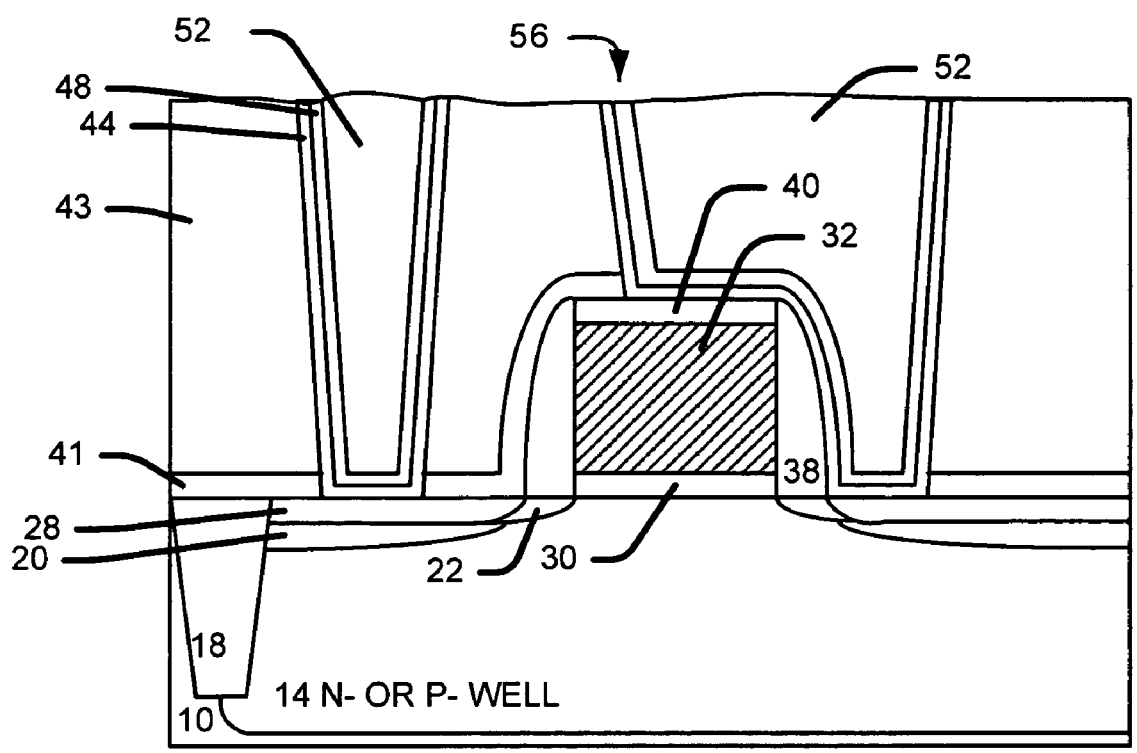

Referring to FIG. 3, we perform a touch up etch to try to remove any W residue on the top surface (such as of dielectric layer 43 and plug) after the CMP. To clean, we can reactive ion etch the contact plug, the first barrier layer, the second barrier layer and the dielectric layer.

The W touch up RIE can be done in any metal etch RIE tool. The main etch chemistry comprise a Cl and B containing etch and is more preferably a $Cl_2$ and $BCl_3$ containing etch chemistry.

A feature of the embodiment's Cl and B containing etch is that the etch rate of the first barrier layer 44 (e.g., Ta) and the second barrier layer 48 (e.g., TaN or WN) is similar or about equal to (e.g., within +/−5%) the etch rate of W. The etch time can be between 1 and 2 minutes. The etch can removed a thickness of the W contact plug 52 between about 200 to 500 A and an oxide 43 thickness between about 300 to 800 A.

The etch parameters are preferably set to get the etch rates of the dielectric layer (e.g., oxide) the barrier layers and the plug (e.g., w) with 10% and more preferably within 5%.

FIG. 3 shows top surfaces 56 of the barrier layers and the absence of the "slit" (such as the etching of the barrier layers 44 48 selective to the W plug and the dielectric layer).

The embodiment's refractory metal nitrides barrier layers (e.g., TaN and WN) have a better etch resistance to the W touch up etch (comprised of Cl and B) than barrier layers comprised of Ti or/and TiN.

F. Second Dielectric Layer

Higher level dielectric layers and interconnect layers can be formed thereover.

Figure 4:
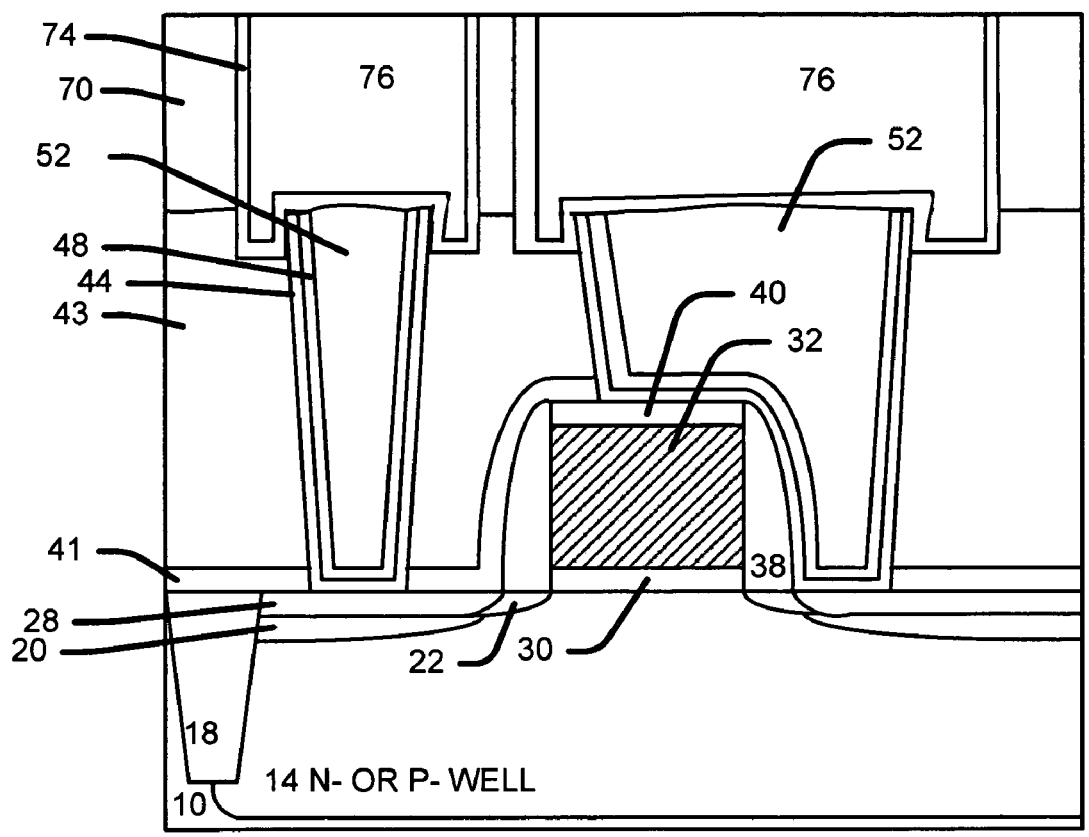

Referring to FIG. 4, we form a second dielectric layer 70 over the first dielectric layer 43 and the first contact plugs 52.

We can form an interconnect opening in the second dielectric layer 70 exposing the contact plug 52.

We can form interconnects (M1) (74 76) in the interconnect openings contacting the contact plugs 52. The interconnects 74 76 can be comprised of a upper barrier layer 74 and upper conductive interconnects 76. The upper barrier layer 74 can be comprised of Ta or TaN. Preferably the upper barrier layer 74 is comprised of a first upper barrier layer and a second upper barrier layer over the first upper barrier layer. The first upper barrier layer can be compromise of Ta and the second upper barrier layer can be comprised of TaN The upper barrier layer can have a thickness between 10 and 500 angstroms.

The upper conductive interconnects 76 can be comprised of Cu.

The device can be further processed using conventional processes.

The embodiments' barrier layers 44 48 that are resistant to the W touch up RIE prevent shorts between the M1 to polysilicon.

II. Second Example Embodiment (e.g., WN Barrier Layer)

A second example embodiment uses a barrier layer comprised of WN. FIGS. 5 thru 8 show the second example embodiment. Similar elements can have the same characteristics as described above for the first embodiment.

We provide a semiconductor structure 10 such as a Si wafer.

We can provide devices on or in the semiconductor structure. For example, we can form a transistor that can be comprised of: a gate dielectric 30, gate electrode 32, gate silicide 40; sidewall spacer(s) 38, SDE 22 and source and drain regions 20; and S/D silicide regions 28.

We can form an etch stop layer 41 over the devices and substrate surface. The etch stop layer 41 can be comprised of silicon nitride.

Next, we can form a dielectric layer 43 over a semiconductor substrate 10. The dielectric layer 43 can be comprised of silicon oxide.

Next, we can form contact holes 42A 42B through the dielectric layer to expose the substrate or silicide 28 (if present). Contact hole 42B shows a subsequent connection between the S/D region 20 and the gate silicide 40.

A. Barrier Layer—WN

Figure 5:
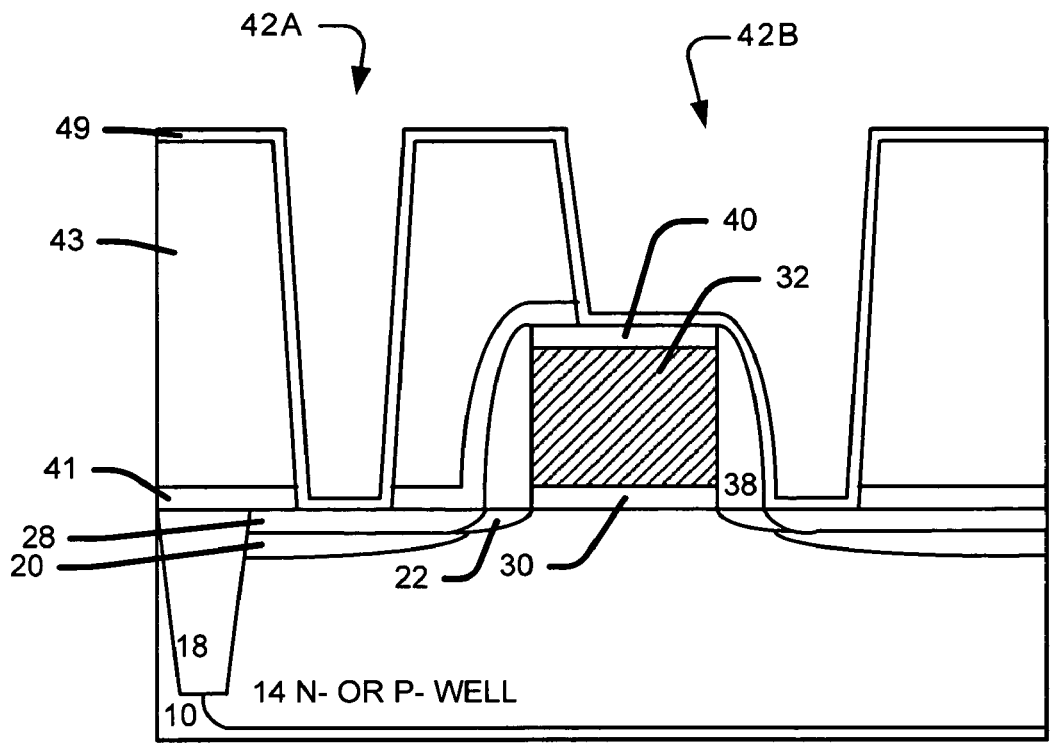
FIGS. 5 through 8 are cross sectional views for illustrating a method for manufacturing contact according to an second example embodiment of the present invention.

Still referring to FIG. 5, we form a first barrier layer 49 over the dielectric layer 43 and the substrate 10 in the contact holes 42A 42B. The first barrier layer 49 can be comprised of WN (tungsten nitride) and preferably consists essentially of tungsten nitride WN. The WN barrier layer can be formed by a chemical vapor deposition process (CVD), Atomic layer deposition process (ALD), or a physical vapor deposition process (PVD). The barrier layer can have a thickness between about 10 and 500 angstroms over the dielectric layer.

B. Contact

We form a first conductive layer (not shown) on the first barrier layer at least filling the contact hole. The first conductive is comprised of tungsten (W) and most preferably W.

Figure 6:
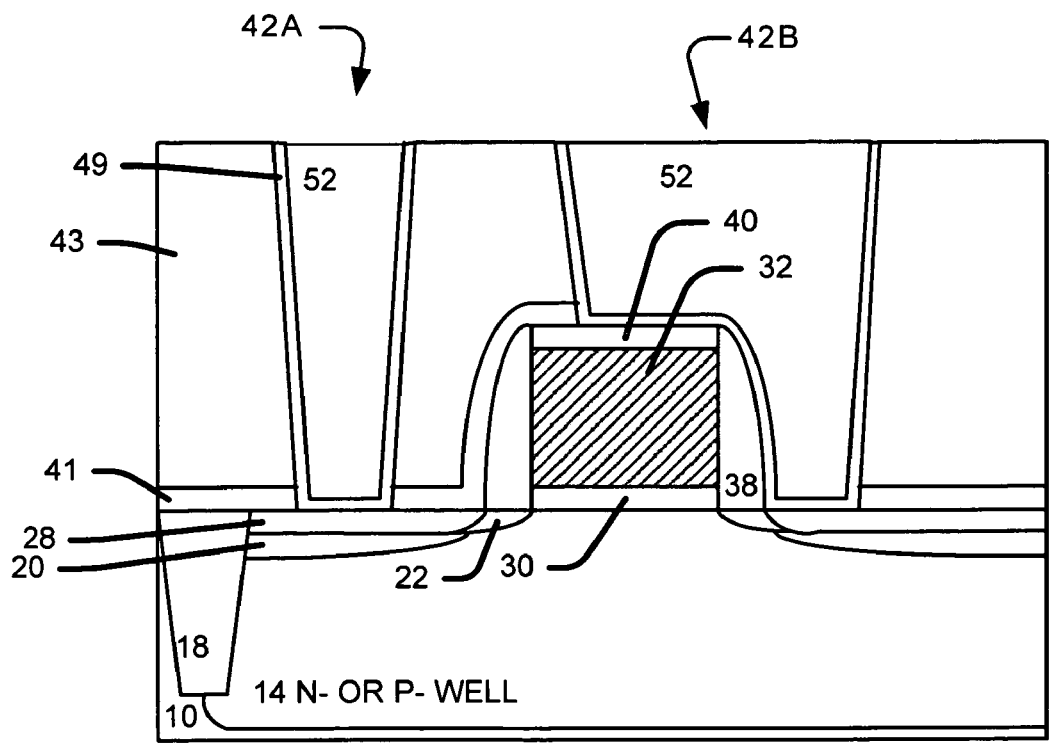

Referring to FIG. 6, we can chemical-mechanical polish (CMP) the first conductive layer to form a first contact plugs 52 in the contact holes. The CMP also preferably removes the first barrier layer 49 on the top of the dielectric layer 43. The CMP process can leave some contaminants on the resulting surfaces.

C. Clean Step—Touch Up Etch

Figure 7:
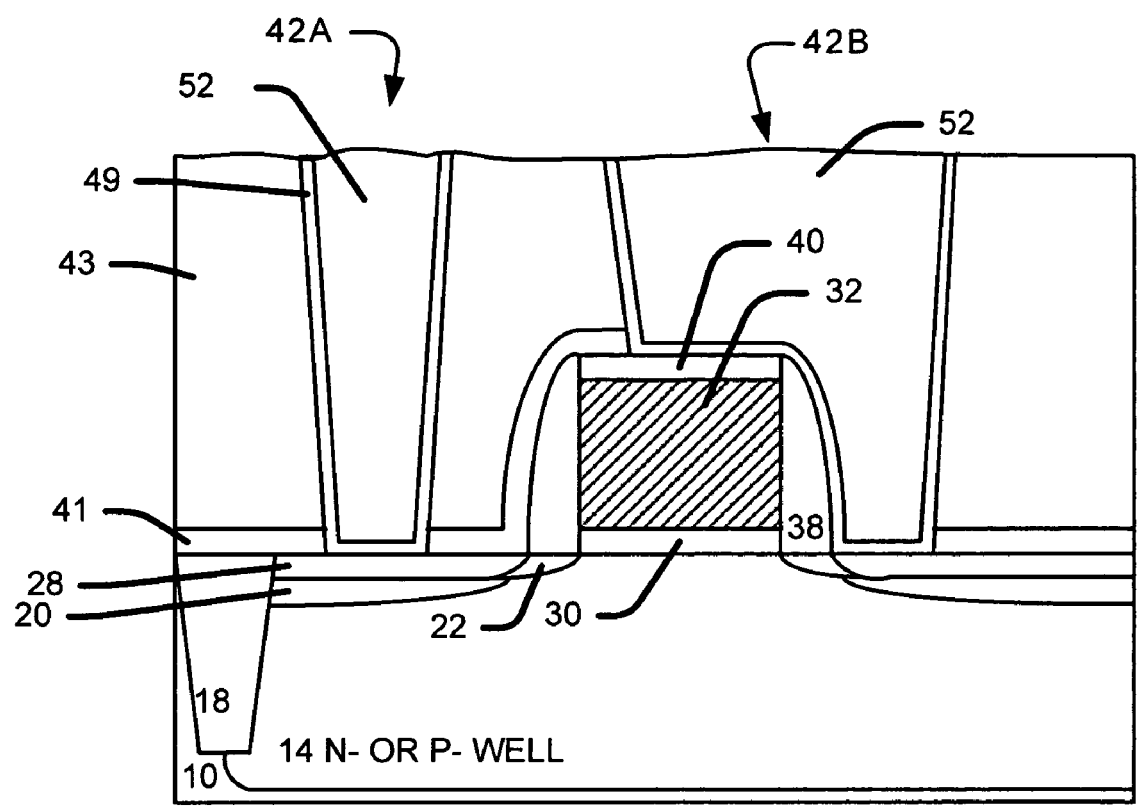

Referring to FIG. 7, we can clean or touch up the surfaces to remove any contaminates and resides left by the previous processes such as the CMP. We can reactive ion etch the contact plug, the first barrier layer, the second barrier layer and the dielectric layer to remove contaminates such as W particles after the W CMP.

The touch up RIE process can be the same as describe above in the first embodiment.

FIG. 7 shows top surfaces 56 of the barrier layers are about even with the top surfaces of the W plug 52 and the dielectric layer 43. Also note the absence of a sidewall "slit" between the plug 52 and the dielectric layer 43 (etching of the barrier layer 49 selective to the W plug and the dielectric layer) that can cause problems. The barrier layer, the dielectric layer and the plug have about the same etch rates (preferably within +/−5%) in the RIE touch up clean etch comprising B and Cl.

The etch parameters are preferably set to get the etch rates of the dielectric layer (e.g., oxide) the barrier layers and the plug (e.g., W) +/− within 10% and more preferably within +/−5%.

D. Upper Interconnect (e.g., M1)

Figure 8:
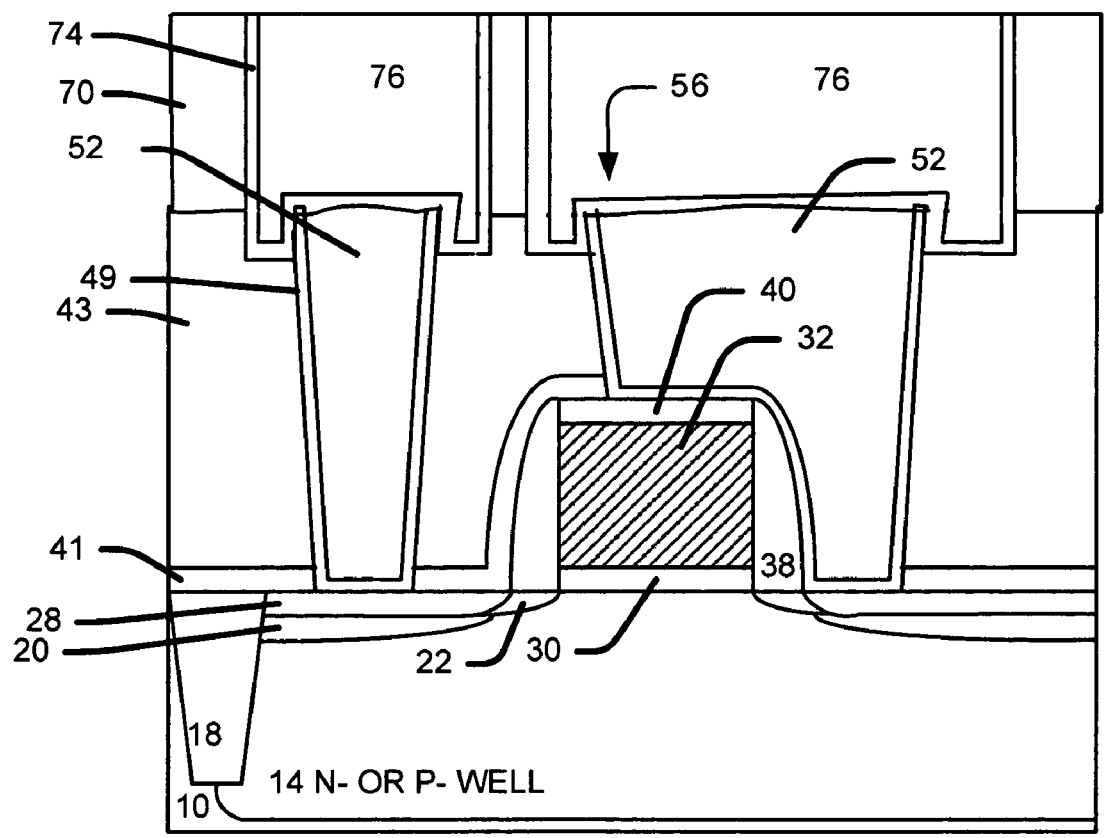

Referring to FIG. 8, we form a second dielectric layer 70 over the first dielectric layer 43 and the first contact plugs 52.

Next we form an interconnect opening in the second dielectric layer exposing the contact plug.

We form an interconnect 74 76 in the interconnect opening contacting the contact plug. The interconnects 74 76 can be comprised of a upper barrier layer 74 and upper conductive interconnects (e.g., Cu) 76. The upper barrier layer 74 and upper interconnect can be made as described above in the first embodiment.

The device can be further processed using conventional processes.

E. A Problem Some Example Embodiments Could Solve

Figure 9A:
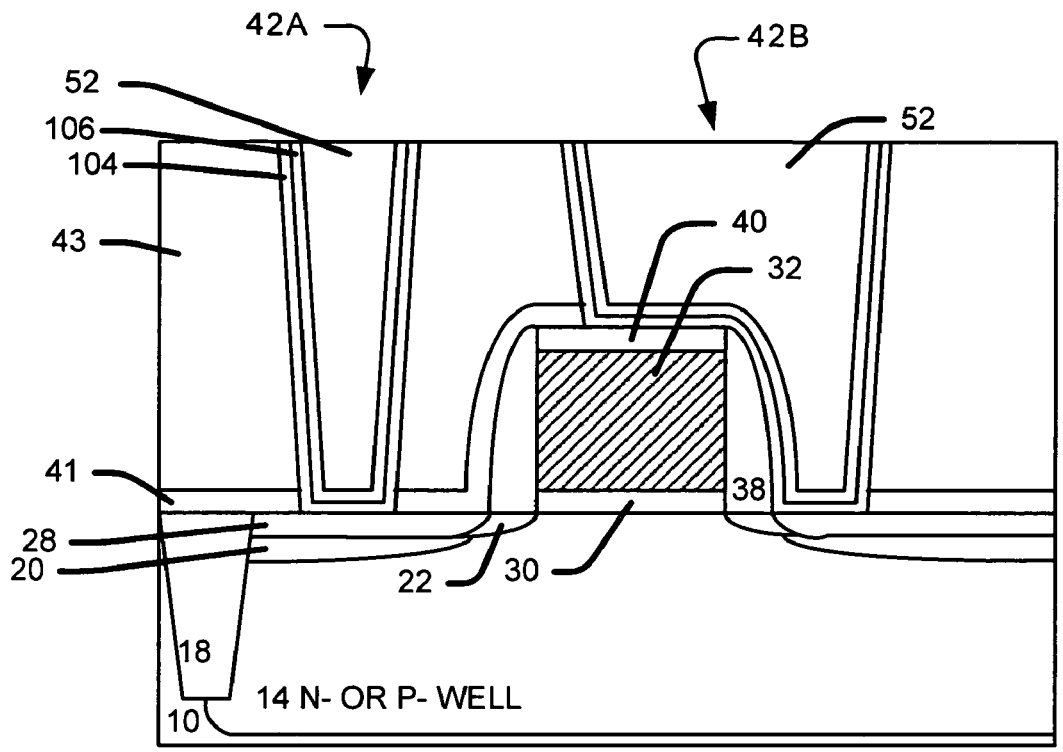
FIGS. 9A, 9B and 10 are cross sectional views for illustrating a method for manufacturing contact according to an process known by the inventors (not prior art).
Figure 9B:
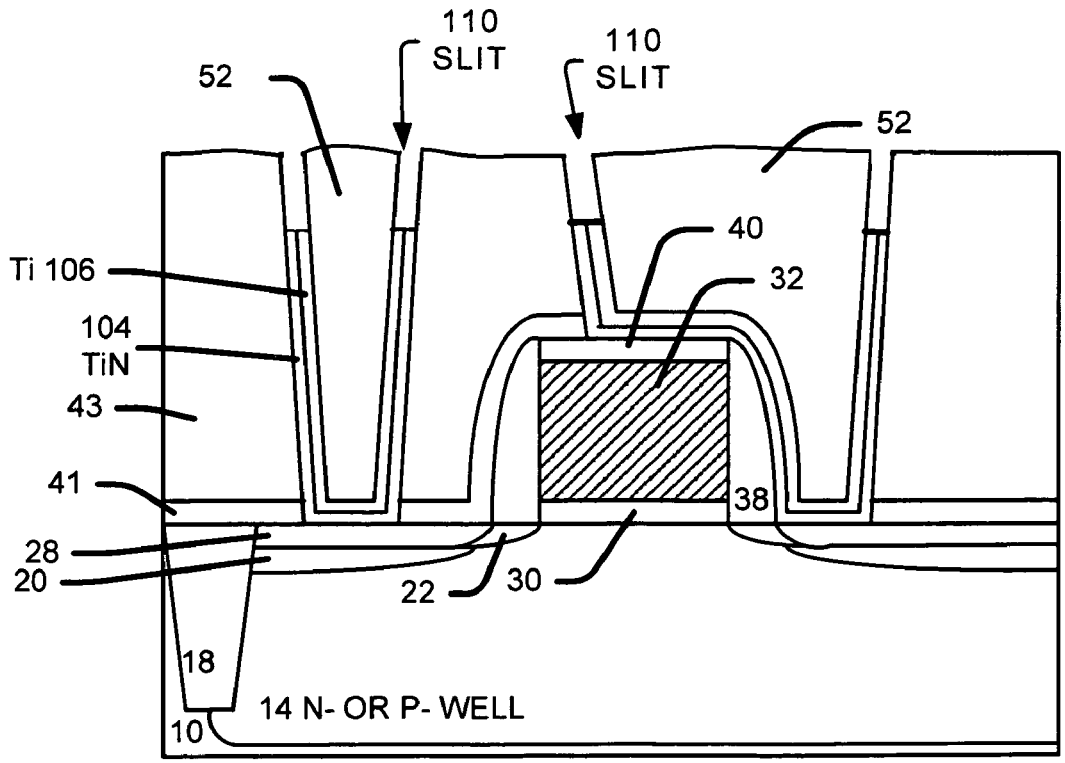
Figure 10:
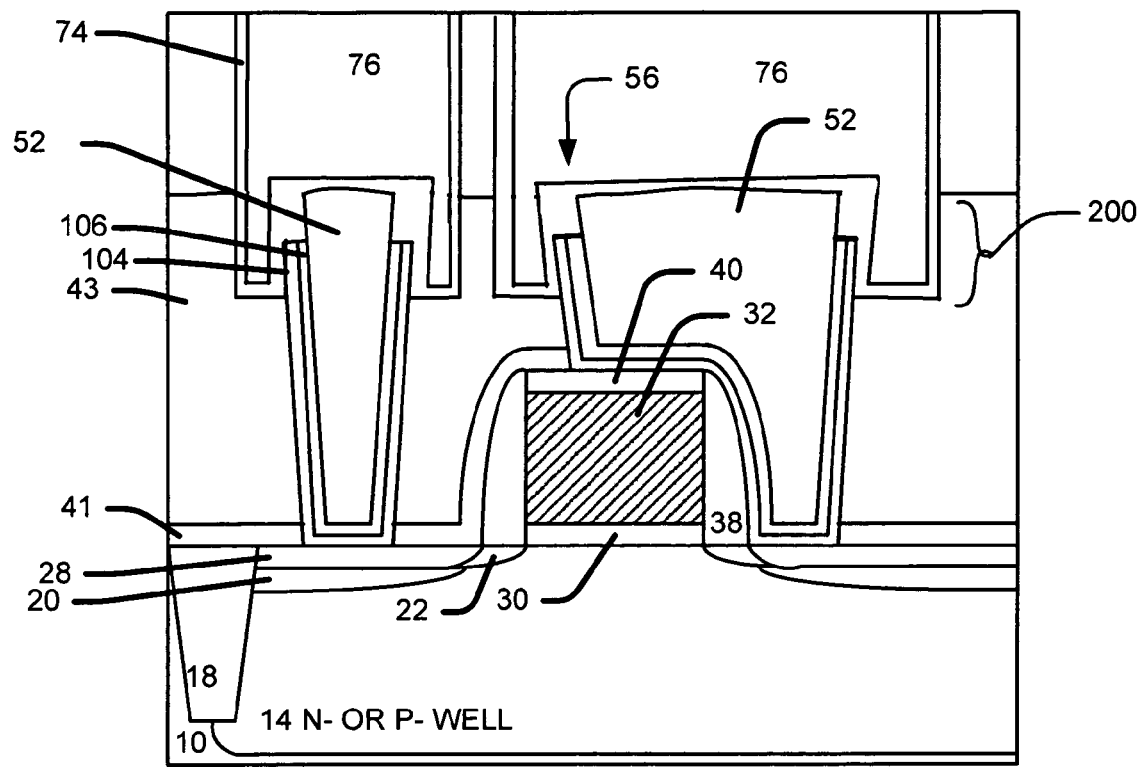

Referring now to the drawing and more particularly to FIGS. 9A, 9B and 10, there is shown a contact structure over which some of the example embodiments of the present invention are an improvement. It is to be understood in this regard that no portion of FIGS. 9A, 9B and 10 are admitted to be prior art as to the present invention. FIGS. 9A, 9B and 10 are not prior art. Rather, this highly simplified diagram is an effort to provide an improved understanding of possible problems that are overcome by the some of the example embodiments of the invention.

FIG. 9A shows a cross sectional view of a contact plug 52 and barrier film 104 106 after W plug 52 CMP.

FIG. 9B shows a cross sectional view of a contact plug 52 and barrier film 104 106 after a RIE touch up etch (e.g., $Cl_2$ and $BCl_3$ chemistry). The barrier film is comprised of a first barrier layer 104 comprised of Ti and a second overlying barrier layer 106 comprised of TiN. A W plug is formed in the opening over the barrier film 104 106.

As shown FIG. 9B, the RIE etches the barrier film 104 106 at a fairly fast rate compared to the dielectric layer 43 and W plug 52 to form sidewalls slits 110. The etch rates of Ti and TiN (barrier layers 104 106) in $Cl_2$ and $BCl_3$ etch chemistries are at least 2 times faster (e.g., 200%) than that of W (W plug 52).

The slit is bad because it may cause the M1 overetch into contact dielectric layer 43 which may result in a M1 to polysilicon short.

Referring to FIG. 10, we can see that the M1 litho and RIE (reactive ion etch) provide an excessive over etch that creates a hole 200 in the dielectric layer near the sidewall slit because the slit allowed the RIE to start deep below the dielectric layer surface. This can cause an upper interconnect 76 to gate 32 short. In some cases, the distance (dielectric layer 43 thickness) between bottom of M1 line 76 and top poly gate 32 can be as small as 500 A. The sidewall slit and subsequent over etch can cause the upper interconnect 76 to gate 32 short.

III. Aspects of the Example Embodiments

The example embodiments of the invention form barrier layers under a W contact plug. The barrier layers are resistant to a particular RIE etch used on a W touch up etch after a W plug CMP step. The combination of the compositions of the barrier layers (e.g., Ta, TaN and WN) and the W touch up RIE etch chemistry (e.g., Cl and B) prevent the problem of a slit formation that can cause shorts.

A. Non-Limiting Example Embodiments

In the above description numerous specific details are set forth such as flow rates, pressure settings, thicknesses, etc., in order to provide a more thorough understanding of the present invention. Those skilled in the art will realize that power settings, residence times, gas flow rates are equipment specific and will vary from one brand of equipment to another. It will be obvious, however, to one skilled in the art that the present invention may be practiced without these details. In other instances, well known process have not been described in detail in order to not unnecessarily obscure the present invention.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabricating an integrated circuit comprising:
   providing a substrate prepared with a dielectric layer with a contact plug opening;
   lining the contact plug opening with a barrier layer; and
   filling the contact plug opening with a conductive material to form a contact plug in the contact plug opening;
   polishing the substrate, wherein polishing produces a top surface of the contact plug which is coplanar with top surfaces of the barrier layer and dielectric layer; and
   cleaning with a touch up etch after polishing to remove residue of the conductive material on the dielectric layer, wherein the touch up etch etches the barrier layer and conductive material at similar etch rates to avoid corrosion of the barrier layer which causes contact plug sidewall slit.

2. The method of claim 1 wherein the conductive material filling in the contact plug opening comprises tungsten.

3. The method of claim 1 wherein:
   the conductive material comprises a non-copper conductive material; and
   the barrier layer comprises refractory metal or nitrides thereof including Ta, TaN, WN or a combination thereof.

4. The method of claim 1 comprises forming a sub-barrier layer between the dielectric layer and the barrier layer.

5. The method of claim 3 wherein an etch chemistry of the touch up etch comprises Cl and B.

6. The method of claim 4 wherein an etch chemistry of the touch up etch comprises Cl and B.

7. The method of claim 4 wherein the sub-barrier layer comprises Ta.

8. The method of claim 7 wherein an etch chemistry of the touch up etch comprises Cl and B.

9. A method of fabricating a semiconductor device comprising:
   providing a substrate prepared with circuit elements thereon;
   forming a dielectric layer on the substrate;
   patterning the dielectric layer to form a contact plug opening;
   lining the contact plug opening with a barrier layer;
   forming a contact plug in the opening, wherein the contact plug comprises a barrier layer lining the opening and a conductive material filling the contact opening, the conductive material having a top surface coplanar with top surfaces of the barrier layer and dielectric layer from polishing; and
   cleaning with a touch up etch after polishing to remove residue of the conductive material on the dielectric layer, wherein the touch up etch etches the barrier layer and conductive material at similar etch rates to avoid corrosion of the barrier layer which causes contact plug sidewall slit.

10. The method of claim 9 wherein the etch rates of the conductive material and the barrier layer are within 10% of each other during cleaning.

11. The method of claim 9 wherein the barrier layer comprises refractory metal or nitrides thereof including Ta, TaN, WN or a combination thereof, and the method comprises forming a sub-barrier layer between the dielectric layer and the barrier layer.

12. The method of claim 9 wherein an etch chemistry of the touch up etch comprises Cl and B.

13. The method of claim 10 wherein an etch chemistry of the touch up etch comprises Cl and B.

14. The method of claim 11 wherein the sub-barrier layer has an etch rate substantially similar to that of the conductive material and the barrier layer during cleaning.

15. The method of claim 11 wherein the sub-barrier layer has an etch rate within 10% of that of the conductive material and the barrier layer during cleaning.

16. The method of claim 11 wherein an etch chemistry of the touch up etch comprises Cl and B.

17. A method of fabricating a semiconductor device comprising:
   providing a substrate prepared with circuit elements thereon;
   forming a dielectric layer on the substrate;

patterning the dielectric layer to form a contact plug opening;

depositing a barrier layer on the substrate, the barrier layer lining the contact plug opening;

depositing a conductive material to fill the contact plug opening;

polishing the substrate to remove excess conductive material and barrier layer over the dielectric layer to form a contact plug in contact with the barrier layer, wherein a top surface of the contact plug is coplanar with top surfaces of the barrier and dielectric layers; and cleaning with a touch up etch after polishing to remove residue of the conductive material on the dielectric layer, wherein the touch up etch etches the barrier layer and conductive material at similar etch rates to avoid corrosion of the barrier layer which causes contact plug sidewall slit.

18. The method of claim 17 wherein the barrier layer comprises refractory metal or nitrides thereof including Ta, TaN, WN or a combination thereof, and the method comprises forming a sub-barrier layer between the dielectric layer and the barrier layer.

19. The method of claim 17 wherein the etch rates of the conductive material and the barrier layer are within 10% of each other during cleaning.

20. The method of claim 18 wherein the sub-barrier layer has an etch rate substantially similar to that of the conductive material and the barrier layer during cleaning of the contact plug.

21. The method of claim 20 wherein the sub-barrier layer has an etch rate within 10% of that of the conductive material and the barrier layer during cleaning.

22. A method of fabricating a device comprising:
providing a substrate prepared with a first layer;
patterning the first layer to form an opening; and
forming a fill in the opening, the fill comprises a liner layer lining the opening and a second material filling the opening, wherein top surfaces of the liner layer, second material, and first layer are coplanar,
wherein the liner layer and the second material can be etched with similar etch rates during a subsequent touch up etch to remove residue of the second material on the first layer to avoid formation of sidewall slits due to corrosion of the liner layer.

23. The method of claim 22 wherein the opening comprises a contact plug opening and filling the contact plug opening forms a contact plug.

24. The method of claim 22 wherein:
the first material comprises a dielectric material;
the liner layer comprises a refractory metal or nitrides thereof including Ta, TaN, WN or a combination thereof; and
the second material comprises a conductive material including tungsten.

25. The method of claim 23 further comprises:
polishing the second material to form the contact plug; and
performing the subsequent touch up etch to remove residue of the second material on the first layer.

26. The method of claim 25 wherein an etch chemistry of the touch up etch comprises Cl and B.

27. The method of claim 24 further comprises:
polishing the second material to form the contact plug; and
performing the subsequent touch up etch to remove residue of the second material on the first layer.

28. The method of claim 27 wherein an etch chemistry of the touch up etch comprises Cl and B.

29. A method of fabricating a semiconductor device comprising:
providing a substrate prepared with a dielectric layer with a contact plug opening;
lining the contact plug opening with a barrier layer comprising refractory metal or nitrides thereof including Ta, TaN, WN or a combination thereof;
filling the contact plug opening with a non-copper conductive material comprising W to form a contact plug in the contact plug opening;
polishing the substrate, wherein a top surface of the contact plug is coplanar with top surfaces of the barrier layer and dielectric layer; and
cleaning with a touch up etch after polishing to remove residue of the conductive material on the dielectric layer, wherein the touch up etch etches the barrier layer and conductive material at similar etch rates to avoid contact plug sidewall slit formation.

* * * * *